United States Patent
Sunaba et al.

(10) Patent No.: US 7,190,235 B2
(45) Date of Patent: Mar. 13, 2007

(54) SURFACE MOUNTED CRYSTAL UNIT

(75) Inventors: Susumu Sunaba, Saitama (JP); Naoyuki Yamamoto, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 93 days.

(21) Appl. No.: 11/188,414

(22) Filed: Jul. 25, 2005

(65) Prior Publication Data
US 2006/0022557 A1    Feb. 2, 2006

(30) Foreign Application Priority Data

Jul. 30, 2004  (JP) .............................. 2004-223152
Jan. 18, 2005  (JP) .............................. 2005-010135

(51) Int. Cl.
*H03H 9/10*  (2006.01)
*H03B 5/32*  (2006.01)

(52) U.S. Cl. .................... 331/68; 331/158; 331/108 D; 310/348

(58) Field of Classification Search ................ 331/68, 331/158, 108 D
See application file for complete search history.

(56) References Cited

U.S. PATENT DOCUMENTS 7,076,870 B2 *  7/2006  Hsieh ........................... 29/852
2004/0041640 A1 *  3/2004  Harima et al. ................. 331/57

FOREIGN PATENT DOCUMENTS

JP         08279725 A     10/1996

(Continued)

OTHER PUBLICATIONS

Internet Publication, "The Wound Toroid," www.lodestonepacific.com/techlib/tmappnotel.html.
European Search Report dated Nov. 17, 2005.

*Primary Examiner*—Joseph Chang
(74) *Attorney, Agent, or Firm*—Scott D. Wofsy; Edwards Angell Palmer & Dodge LLP

(57) ABSTRACT

A surface mounting base for an oscillator that is provided with: an insulation base comprising a casing wall having a through hole; a sealing glass that is filled into the through hole and forms a space part on one principal surface side of the insulation base; and a J lead terminal, which passes through the sealing glass and clamps an inner surface and an outer surface of the casing wall, and which has a holding part for a crystal element on a top surface of the sealing glass that is one principal surface side of the insulation base, and which has a tip end part bent in a concave shape projecting from a bottom surface of the sealing glass and extending from the inside of the casing wall towards the outside across a tip end surface, and in which the tip end part is soldered to the insulation base. Moreover, a base part of the J lead terminal projects below the bottom surface of the sealing glass, and the inner surface of the tip end part is distanced from the bottom surface of the sealing glass by at least the thickness of the J lead terminal or more. As a result, a surface mounting base in which distortion of the insulation base and the set substrate is cancelled, and compatibility is well maintained, and a highly reliable crystal oscillator which uses this surface mounting base are provided.

8 Claims, 7 Drawing Sheets

FOREIGN PATENT DOCUMENTS

| | | |
|---|---|---|
| JP | 11031939 A | 2/1999 |
| JP | 11103231 A | 4/1999 |
| JP | 2000286661 A | 10/2000 |
| JP | 2003-297453 | 10/2003 |
| JP | 2003297453 A | 10/2003 |

* cited by examiner

SURFACE MOUNTED CRYSTAL UNIT

BACKGROUND OF THE INVENTION

1. Technical Field

The present invention relates to a surface mounting base for an oscillator that uses a J lead terminal, and to a crystal oscillator that uses the surface mounting base (hereinafter, referred to as a "surface mounted crystal unit"), and in particular to a surface mounted crystal unit having excellent compatibility with a set substrate that mounts the surface mounted crystal unit.

2. Background Art

Since a surface mounted crystal unit is small in size and is light weight, it is used particularly inside portable electronic devices. Usually, a crystal element is mounted on a surface mounting base and is hermetically sealed. Recently, a surface mounting base that takes into consideration its compatibility with a set substrate on which the surface mounted crystal unit is mounted, has been proposed (see Japanese Unexamined Laid-open Patent Publication No. 2003-297453).

FIG. 5 is a diagram for explaining a conventional example, wherein FIG. 5A is a vertical sectional view of a conventional surface mounted crystal unit, and FIG. 5B is a plan view of the crystal element thereof.

As shown in FIG. 5A, the surface mounted crystal unit is constructed such that a crystal element 2 is mounted on a surface mounting base 1 and is covered and hermetically sealed with a cover 3. The surface mounting base 1 comprises an insulation base 4, lead terminals 5, and a sealing glass 6. The insulation base 4 is made from alumina ceramic for example, and has a pair of through holes 7 on its opposite end sides. In these pair of through holes 7, the sealing glass 6 with the lead terminals 5 passing therethrough, is embedded in gaps between the through holes 7 and the lead terminals 5, forming a so-called airtight terminal.

Each lead terminal 5 is made from metal such as Cu, and has a crank shaped cross-section as shown in FIG. 5A, and comprises a holding part 5a, a through part 5b, and a mounting terminal part 5c. The holding part 5a and the mounting terminal part 5c are formed bent in horizontally reversed directions on the top and bottom sides of the through part 5b, as shown in the diagram. The sealing glass 6 is made from solid state powdered glass, and is poured into the pair of through holes 7, and is melted integrally with the insulation base 4 and the lead terminals 5.

Moreover, the crystal element 2 is, for example, an AT-cut crystal as shown in FIG. 5B. Its both principal surfaces have an excitation electrode 8, from both ends of which extension electrodes 9 extend. In addition, both end parts of the crystal element 2 from which the extension electrodes 9 extend are fixed to the holding part 5a of the lead terminal 5 by an electrically conductive adhesive (not shown). The cover 3 is made from insulating material such as ceramic, and as shown in FIG. 5A, is bonded on the periphery, which is one principal surface side of the surface mounting base 1 (insulation base 4), by glass sealing for example.

In such a conventional surface mounted crystal unit, as shown in FIG. 5A, the mounting terminal part 5c of the lead terminal 5 is bonded on a circuit terminal part of a set substrate (not shown) by means of soldering for example. In this case, since the mounting terminal part 5c is made from metal and has elasticity, it absorbs any difference in an expansion coefficient, between the surface mounting base (ceramic) 1 and the set substrate (such as a glass epoxy substrate). Therefore, when the surface mounted crystal unit is in use, external impact acting on the bonding part between them (the surface mounting base and the set substrate) due to heat cycling and the like is lessened, and for example, the generation of a crack or chip that might occur in the solder is prevented. As a result, the compatibility between the surface mounting base 1 and the set substrate becomes excellent.

However, in the surface mounting base 1 of such a conventional surface mounted crystal unit, first the lead terminals 5 are inserted into the through holes 7 and are clamped using a jig, and powdered glass is poured into the through holes 7 and is melted to integrate them. However, there has been a problem in that the through parts 5b of the lead terminals 5 are loose in the hollow part in the through holes 7 and their positioning becomes unstable, causing difficulty in manufacturing.

In consideration of such a problem, a surface mounting base shown in FIG. 6 has been devised. Here FIG. 6A is a vertical sectional view of another conventional surface mounted crystal unit, and FIG. 6B is a transverse sectional view (partial enlargement) along the line A—A of FIG. 6A.

In this conventional example, an insulation base 4 that functions as a surface mounting base, comprises an annular casing wall 4a having a single through hole 7. Furthermore, a pair of lead terminals 5 is made from Cu, and is constructed such that a folded part 5d is added to a holding part 5a, a through part 5b, and a mounting terminal part 5c. A projection 10 formed on the through part 5b, and an elbow shaped part of the folded part 5d are elastically contacted with the outside and inside of the insulation base 4 (casing wall 4a). Here, the lead terminal 5 is referred to as a J lead terminal that clamps the casing wall 4a (insulation base 4) (for information about J lead terminals refer to FIG. 15 and its description in http://www.lodestonepacific.com/techlib/tmappnotel.html).

In other words, the J lead terminal 5 passes through the sealing glass 6 and clamps the inside and outside of the annular casing wall 4a (insulation base 4), and has the holding part 5a for the crystal element 2 positioned above the top surface 6a of the sealing glass 6, which is one principal surface side of the insulation base 4. Moreover, the J lead terminal 5 is formed from the through part 5b which is embedded in the sealing glass 6, and projects from the bottom surface 6b of the sealing glass 6, the mounting terminal part (tip end part) 5c which extends from the inside of the annular casing wall 4d across the tip end surface to the outside of the annular casing wall 4a, and bends in a concave shape, and the folded part 5d. The J lead terminal 5 is soldered onto the insulation base 4.

Here, a slit 12 is provided in the center area on the through part 5b of the J lead terminal 5, and first and second bifurcated through parts 5b1 and 5b2 are formed. Moreover, the first and second bifurcated through parts 5b1 and 5b2 respectively have projections 10 that contact with the inside of the casing wall 4a (base 4). In a condition with the J lead terminal 5 which is bent in a concave shape, elastically clamped to the insulation base 4, and the tip end part (mounting terminal 5c), which is the flat bent part, pressed against the tip end surface 4b of the annular casing wall 4a (base 4), solid state powdered glass is filled into the single hole 7, and the sealing glass 6 is fired to integrate them.

In this case, since the J lead terminal 5 elastically clamps the inside and outside of the insulation base 4, disengagement of the J lead terminal 5 from the insulation base 4, or movement can be prevented without requiring a jig. Furthermore, since the projection 10 is provided on the through part 5b of the J lead terminal 5, a gap is created between the inside of the insulation base 4 (annular casing wall 4*a*) and the J lead terminal 5. In addition, the through part 5*b* of the J lead terminal 5 is constructed from the first and second bifurcated through parts 5*b*1 and 5*b*2, and the slit 12 is provided between them. Therefore, in the through hole 7, the molten glass readily enters into the gap with the inside of the casing wall 4*a*, from both sides of the through part 5*b* and from the center slit 12. As a result, manufacturing of the surface mounting base becomes easier.

Furthermore, since the through hole 7 formed in this insulation base 4*a* is a single one, a large amount of powdered glass can be filled thereinto. Therefore, molten glass will readily enter the gap between the insulation base 4 and the lead terminal 5 at the time of melting, thus realizing an effect that manufacturing can be made even easier. This effect becomes greater when the size of the insulation base 4 is small and the amount of powdered glass to be filled is small.

However, in the surface mounted crystal unit of this other conventional example, even though the tip end part 5*c* of the J lead terminal 5 is contacted against the end surface of the annular casing wall 4*a* (base 4), in practice a micro-gap c is created between them as shown in FIG. 7. Therefore, when the powdered glass is melted, molten glass enters the gap beneath the bottom surface 4*b* of the base 4 from the inner surface of the annular casing wall 4*a* (area indicated by P in FIG. 7) by capillarity, as shown in the partially enlarged vertical sectional view of FIG. 7, so that the bottom surface of the casing wall 4*a* and the mounting terminal part (tip end part) 5*c* are integrated. As a result there has been a problem in that a free motion surface of the mounting terminal part (tip end part) 5 between the annular casing wall 4*a* and the tip end surface (bottom surface) is reduced (elasticity is reduced), and the absorbance of distortion (stress) when it is mounted on the set substrate is decreased.

Consequently, an object of the present invention is to provide a surface mounting base of enhanced compatibility, which prevents distortion when mounting a surface mounted crystal unit onto a set substrate, and to provide a highly reliable surface mounted crystal unit that uses this surface mounting base.

SUMMARY OF THE INVENTION

The present invention is a surface mounting base for an oscillator that is provided with: an insulation base comprising a casing wall having a single through hole; a sealing glass that is filled into the through hole and forms a space part on one principal surface side of the insulation base; and a J lead terminal, which passes through the sealing glass and clamps an inner surface and an outer surface of the casing wall, and which has a holding part for a crystal element on a top surface of the sealing glass that is one principal surface side of the insulation glass, and which has a tip end part bent in a concave shape projecting from a bottom surface of the sealing glass and extending from the inside of the casing wall towards the outside across a tip end surface, and in which the tip end part is soldered to the insulation base; being a crystal unit surface mounting base provided with the J lead terminal from the bottom surface of the sealing glass, and is constructed such that a base part of the J lead terminal projects from the bottom surface of the sealing glass, and the inner surface of the tip end part is distanced from the bottom surface of the sealing glass by at least the thickness of the J lead terminal or more.

According to such a construction, the base part of the J lead terminal projects from the bottom surface of the sealing glass, and the distance from the bottom surface of the sealing glass to the tip end part of the J lead terminal can be made long. Therefore, even in the case where molten glass enters between the base part (one part of the through part) of the J lead terminal, and the casing wall of the base, the molten glass stops halfway through the base part, and does not enter between the tip end part of the J lead terminal and the tip end surface of the casing wall of the base. In addition, parts that do not contact with the molten glass (sealing glass) occur in the tip end part as well as in the base part of the J lead terminal, and in particular the non-contacting part of the base part comes to function as a stress absorbing part moving freely with respect to externally applied stress.

According to these constructions, even if the tip end part (tip end surface) of the J lead terminal is fixed to the insulation base by soldering, distortion that occurs between the set substrate and the insulation base due to a difference in their expansion coefficients is absorbed by these stress absorbing parts. Accordingly, compatibility of the surface mounted crystal unit with respect to the set substrate can be enhanced. As the base part of the J lead terminal that projects from the bottom surface of the sealing glass becomes longer, the area of the non-contacting part becomes greater and the function of the stress absorbing part also improves.

The tip end surface of the J lead terminal is fixed directly to the insulation base by soldering. Moreover, the free movement on the outer surface of that base part is suppressed by the solder that creeps up on it. However, since the inner surface sides of the tip end part and base part contact with neither the solder nor the sealing glass, they function sufficiently as stress absorbing parts that freely move.

In the surface mounted crystal unit of the present invention, the tip end surface of the casing wall of the base projects from the bottom surface of the sealing glass. Moreover, a projecting part is provided on the tip end surface of the casing wall, and the projecting part projects from the bottom surface of the sealing glass. Alternatively, the tip end surface of the casing wall and the tip end part of the J lead terminal are separated. According to these constructions, since the tip end part and base part of the J lead terminal that project from the bottom surface of the sealing glass contact with neither the sealing glass nor the solder, these function sufficiently as stress absorbing parts that freely move.

Furthermore, in the present invention, the number of the through holes formed in the insulation base is just one. As a result, a large amount of powdered glass can be filled, and its entry between the lead terminal and the inside of the casing wall becomes excellent. In addition, the casing wall, which is on one principal surface side of the insulation base, has a space part that holds the crystal element, which is in a position above the sealing glass. As a result, the crystal element is protected, and contact with external devices during manufacture is prevented.

Furthermore, in the surface mounted crystal unit of the present invention, the crystal oscillator is constructed such that the holding part of the crystal element holds the periphery part of the crystal element, which has its extension electrodes extending from an excitation electrode, and a cover is placed over the surface mounting base for the crystal oscillator, to hermetically seal the crystal element. As a result, compatibility of the insulation base with the set substrate can be made excellent, and a highly reliable crystal oscillator can be obtained.

BRIEF DESCRIPTION OF THE DRAWINGS

FIG. 1 is a diagram for explaining a first embodiment of a surface mounted crystal unit of the present invention, wherein

FIG. 2 is a diagram for explaining a second embodiment of the surface mounted crystal unit of the present invention, wherein

FIG. 3 is a diagram for explaining a third embodiment of the surface mounted crystal unit of the present invention, wherein

FIG. 5 is a diagram for explaining a conventional surface mounted crystal unit, wherein

FIG. 6 is a diagram for explaining a surface mounted crystal unit of another conventional example, wherein

DETAILED DESCRIPTION OF THE PREFERRED EMBODIMENTS

Embodiment 1

Figure 1A:
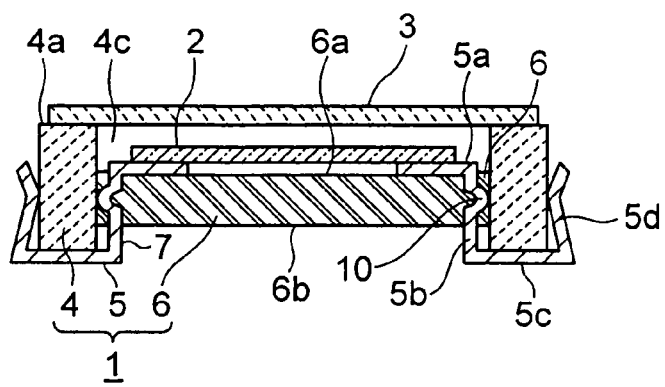
FIG. 1A is a vertical sectional view thereof.
Figure 1B:
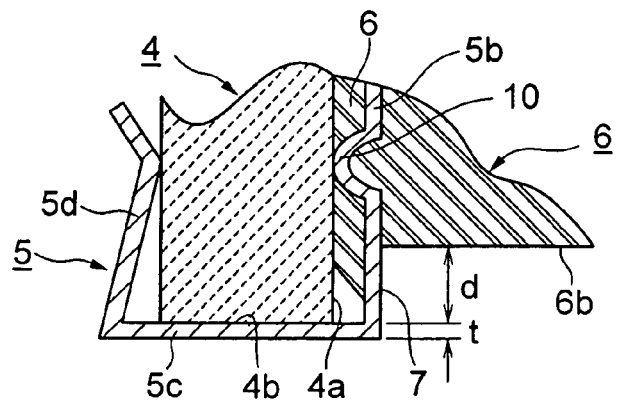
FIG. 1B is a partially enlarged vertical sectional view thereof.
Figure 1C:
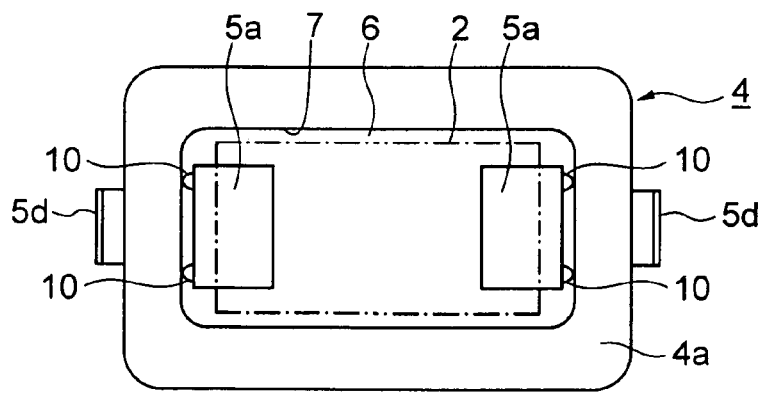
FIG. 1C is a plan view thereof.
Figure 1D:
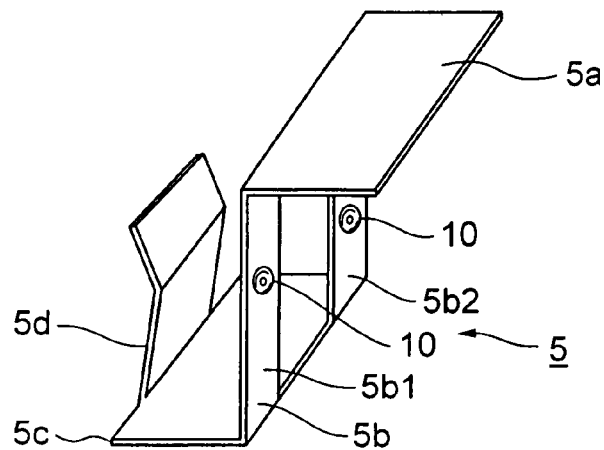
FIG. 1D is a perspective view of a J-lead terminal of a surface mounted crystal unit of the present invention.

FIG. 1 is a diagram for explaining a first embodiment of a surface mounted crystal unit of the present invention, wherein FIG. 1A is a vertical sectional view of the surface mounted crystal unit, FIG. 1B is a partially enlarged vertical sectional view of the surface mounted crystal unit, FIG. 1C is a plan view of the surface mounted crystal unit with the cover removed, and FIG. 1D is a perspective view of a J lead terminal of a surface mounted crystal unit of the present invention.

In the surface mounted crystal unit of the present invention, as shown in FIG. 1A, a crystal element 2 is mounted on a surface mounting base 1 and is covered and hermetically sealed with a cover 3. The surface mounting base 1 comprises an insulation base 4 made of ceramic or the like, a sealing glass 6, and a J lead terminal 5 (refer to the description in "Background Art" for details of the J lead terminal). The insulation base 4 is formed from an annular casing wall 4a having a single through hole 7. The height of the sealing glass 6 is made lower than that of the insulation base 4 as shown in FIG. 1A, and a space part 4c for accommodating the crystal element 2 is provided on one principal surface of the sealing glass 6.

The J lead terminal 5 is made from Cu, and has a U shape section as shown in FIG. 1A, FIG. 1B, and FIG. 1D, and comprises a holding part 5a, a through part 5b (as shown in FIG. 1D, this may be as a bifurcated through part 5b1 and 5b2), a mounting terminal part 5c, and a folded part 5d. The J lead terminal 5 has the holding part 5a for the crystal element 2 on a top surface 6a of the sealing glass 6, which is one principal surface of the insulation base 4 that is formed with the annular casing wall 4a. Moreover, the through part 5b of the J lead terminal 5 projects from a bottom surface 6b of the sealing glass 6, and extends from inside of the annular casing wall 4a of the insulation base 4 across its tip end surface toward the outside of the casing wall 4a, bending in a concave shape to form the mounting terminal 5c. This terminal part 5c is soldered onto the insulation base 4. Furthermore, the elbow shaped folded part 5d is extended upward from the mounting terminal part (tip end part) 5c. Moreover, for example the two projections 10 which face the inside of the annular casing wall 4a, are formed on the through part 5b of the lead terminal 5 as shown in FIG. 1D, and are elastically contacted with the inside in the annular casing wall 4a.

In addition, here, a base part (one part of the through part 5b) of the J lead terminal 5 projects from the bottom surface 6b of the sealing glass 6 so that the inner surface of the tip end part 5c is distanced from the bottom surface 6b of the sealing glass 6. In this embodiment, the tip end surface of the casing wall 4a where the J lead terminal 5 extends is made to project downward from the bottom surface 6b of the sealing glass 6.

Here, as shown in FIG. 1B, a distance d between the inner surface of the tip end part 5c of the J lead terminal 5 and the sealing glass 6 is at least equal to or greater than a thickness t of the J lead terminal 5. For example, here the thickness t of the J lead terminal 5 is 0.1 mm, and the distance d is 0.5 mm. Moreover, it is designed such that a plan dimension of the insulation base (annular casing wall 4a) 4 is 5.0×3.2 mm and its height is 1.8 mm (excluding the thickness of the J lead terminal 5), a plan dimension of the sealing glass 6 is 3.8×2.0 mm, and the height from the bottom end of the insulation base 4 to the one principal surface (top surface) of the crystal element 2 is 1.3 mm.

According to such a construction, as shown in FIG. 1A and FIG. 1B, the distance d from the bottom surface 6b of the sealing glass 6 to the inner surface of the concave shaped tip end part 5c can be made long at the base part of the J lead terminal 5 which projects from the bottom surface of the sealing glass 6. Therefore, molten glass that has entered between the base part of the J lead terminal 5 and the inner surface of the annular casing wall 4a stops halfway down the base part (the through part 5b projecting from the bottom surface of the sealing glass) of the J lead terminal 5 as shown in FIG. 1B. Therefore the molten glass does not enter between the inner surface of the tip end part 5c of the J lead terminal 5 and the tip end surface 4b of the annular casing wall 4a. As a result there is a part that does not contact with molten glass (sealing glass 6) at the tip end part 5c of the J lead terminal 5 as well as at the base part thereof, and the J lead terminal 5 functions as a stress absorbing part that moves freely with respect to the sealing glass 6. In particular, since the base part of the J lead terminal 5 extends in a vertical direction, its function as a stress absorbing part is improved.

When such a surface mounted crystal unit of the present invention is mounted on a predetermined set substrate, solder adheres directly to the tip end part 5c of the J lead terminal 5, especially on its tip end surface. Moreover, the solder that has crept up from the bottom surface adheres to the outer surface (one part of the through part 5b) of the base part. On the other hand, the flooding of solder into the inner surface of the base part and the tip end part 5c of the J lead terminal is controlled, and the J lead terminal comes to contact with neither the sealing glass 6, nor the solder. Accordingly, distortion occurring between the surface mounted crystal unit and the set substrate due to a difference in expansion coefficients is sufficiently absorbed by these stress absorbing parts. Moreover, as the base part of the J lead terminal 5 projecting from the bottom surface 6b of the sealing glass 6 becomes longer, the non-contacting area becomes greater, and the function of the stress absorbing part improves. Furthermore, since the J lead terminal is made from Cu, it sufficiently functions as a stress absorbing part due to its having flexibility (elasticity).

Since solder has a greater flexibility than the sealing glass 6, the function of the stress absorbing part functions more sufficiently in the case where the tip end part 5c and the outer surface of the base part of the J lead terminal 5 are integrated with solder than in the case where the tip end part 5c and the inner surface of the base part are integrated with the sealing glass 6 by means of firing. However, as described above, when the non-contacting area at the base part of the J lead terminal 5 is greater, the function as a stress absorber is improved compared to either with the sealing glass 6 or the solder.

Furthermore, in this embodiment, by making the height of the insulation base 4 formed from the annular casing wall 4a greater than that of the sealing glass 6, the space part 4c is formed between them, and the crystal element 2 is accommodated therein. Accordingly, the crystal element 2 is surrounded by the annular casing wall 4a and is not exposed from above the one principal surface of the insulation base 4. As a result, damage to the crystal element 2 can be prevented, as it does not make contact with a jig or devices and so forth in the manufacturing process of the surface mounted crystal unit.

Embodiment 2

Figure 2A:
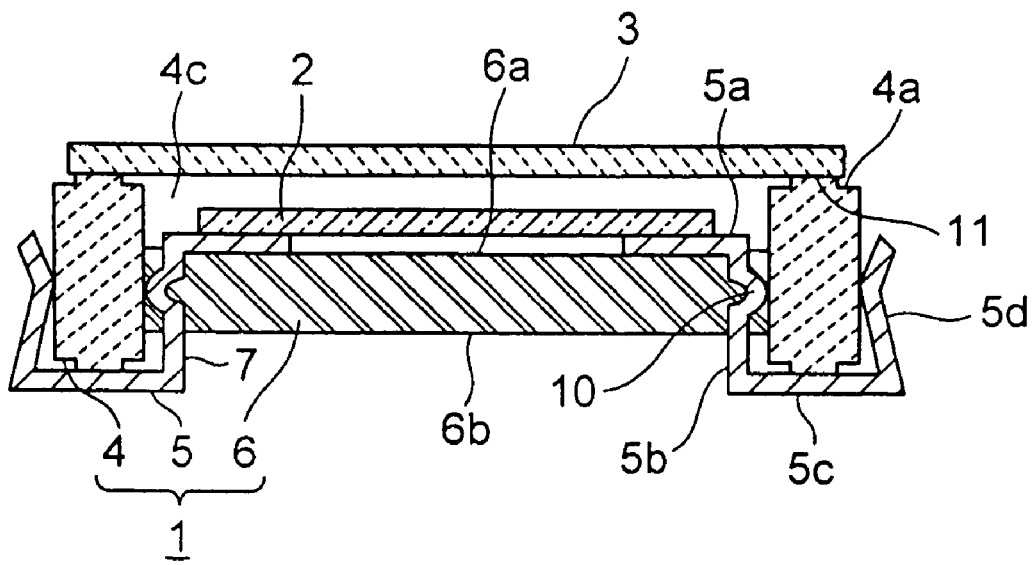
FIG. 2A is a vertical sectional view thereof.
Figure 2B:
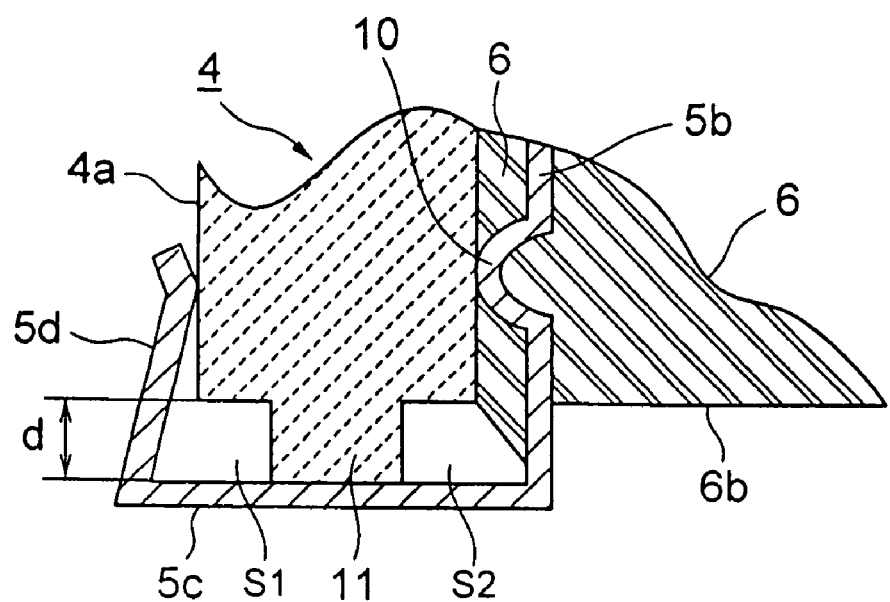
FIG. 2B is a partially enlarged vertical sectional view thereof.

FIG. 2 is a diagram for explaining a second embodiment of the surface mounted crystal unit of the present invention, wherein FIG. 2A is a vertical sectional view of the surface mounted crystal unit, and FIG. 2B is a partially enlarged vertical sectional view of the surface mounted crystal unit.

In this second embodiment also, as with the first embodiment, as shown in FIG. 2A and FIG. 2B, the base part (part of the through part 5b) of the J lead terminal 5 projects from the bottom surface 6b of the sealing glass 6, and the inner surface of the concave shaped tip end part (mounting terminal part 5c) is distanced from the bottom surface 6b of the sealing glass 6. In this second embodiment, convex projecting parts 11 are symmetrically provided on opposite tip end surfaces of the annular casing wall 4a of the insulation base 4. The height d of the projecting parts 11 is at least equal to or greater than the thickness of the J lead terminal, from the bottom surface of the sealing glass 6. As a result, the base part of the J lead terminal 5 projects from the bottom surface 6b of the sealing glass 6, and its concaved tip end part (mounting terminal part 5c) extends from the inner surface to the outer surface across the tip end surface of the projecting part 11.

According to such a construction, small space parts S1 and S2 as shown in FIG. 2B are formed between the base part of the J lead terminal 5 and the insulation base 4, by the projecting part 11 provided on the tip end surface of the annular casing wall 4a. Therefore, even in the case where the J lead terminal 5 is elastically clamped on the inside and outside of the annular casing wall 4a, and the tip end part 5c is pressed against the tip end surface of the casing wall 4a, and powdered glass is sealed in and fired, due to the small space parts S1 and S2, capillary action does not occur, and molten glass does not enter further towards the tip end part 5c of the J lead terminal.

Therefore, as with the above first embodiment, bonding (integration) of the base part and the tip end part 5c of the J lead terminal 5, and the annular casing wall 4a by the sealing glass is prevented, and a stress absorbing part having a greater free movement plane due to the non-contacting part can be obtained. Accordingly, distortion between the set substrate and the surface mounted crystal unit can be absorbed due to the inherent flexibility (elasticity) of the J lead terminal, which is made from Cu, and compatibility with the set substrate can be well maintained.

Moreover, in this second embodiment, since the projecting parts 11 are symmetrically provided on the top and bottom surfaces of the annular casing wall 4a, either one of the tip end surfaces can be used as a principal surface regardless of its direction. Therefore the manufacturing of the surface mounted crystal unit can be simplified.

Embodiment 3

Figure 3A:
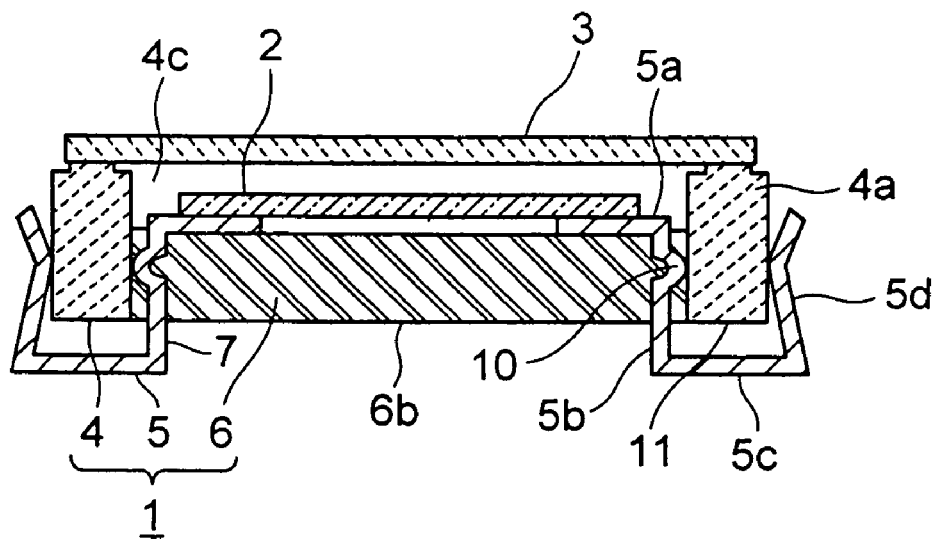
FIG. 3A is a vertical sectional view thereof.
Figure 3B:
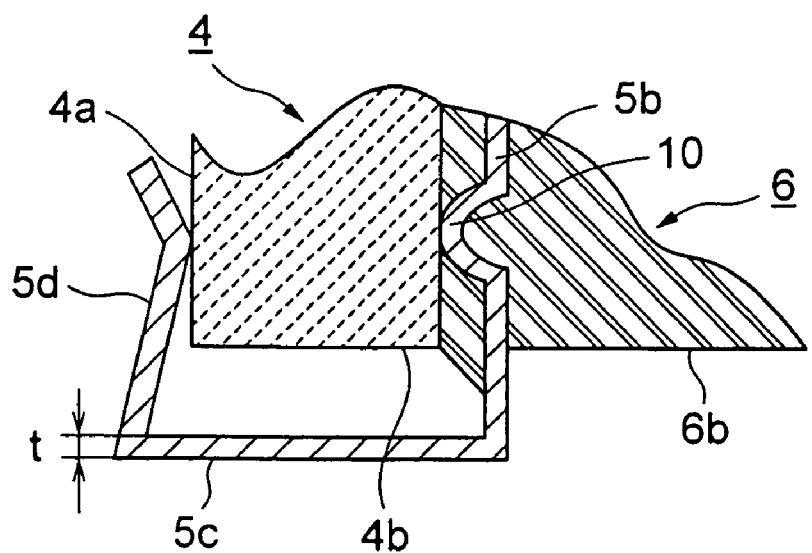
FIG. 3B is a partially enlarged vertical sectional view thereof.

FIG. 3 is a diagram for explaining a third embodiment of the surface mounted crystal unit of the present invention, wherein FIG. 3A is a vertical sectional view of the surface mounted crystal unit, and FIG. 3B is a partially enlarged vertical sectional view of the surface mounting base.

In this third embodiment also, as with the first embodiment and second embodiment, the base part of the J lead terminal 5 (part of the through part 5b) projects from the bottom surface 6b of the sealing glass 6, and the inner surface of the tip end part (mounting terminal part 5c) is distanced from the bottom surface 6b of the sealing glass 6. In this third embodiment, the tip end surface of the annular casing wall 4a, which is the projection side of the J lead terminal 5, and the inner surface of the tip end part of the J lead terminal 5 are distanced from each other by the thickness t of the J lead terminal, or more. Specifically, the concave shaped tip end part 5c of the J lead terminal 5 is arranged so that it is spaced from the tip end surface 4b of the annular casing wall 4a. However, the tip end surface 4b of the annular casing wall 4a and the bottom surface 6b of the sealing glass 6 are here arranged on substantially the same plane.

According to such a construction, the base part of the J lead terminal 5 projects from the tip end surface 4b of the annular casing wall 4a, and from the bottom surface 6b of the sealing glass 6, which is arranged on the same plane, and the tip end part 5c of the J lead terminal 5 is distanced from the tip end surface 4b of the annular casing wall 4a. Therefore, even in the case where the J lead terminal 5 is elastically clamped on the annular casing wall 4a, and power glass is sealed into the space and fired, capillary action does not occur and molten glass does not enter into the base part and the tip end part 5c of the J lead terminal 5.

Therefore, as with the above first embodiment and the second embodiment, bonding (integration) of the base part and the tip end part 5c of the J lead terminal 5, and the annular casing wall 4a by the sealing glass 6 is prevented, and a stress absorbing part can be obtained by the non-contacting part of the J lead terminal. As a result, distortion between the set substrate and the surface mounted crystal unit can be absorbed due to the flexibility (elasticity) of the J lead terminal 5, and compatibility with the set substrate can be maintained well.

Another Embodiment

Figure 4:
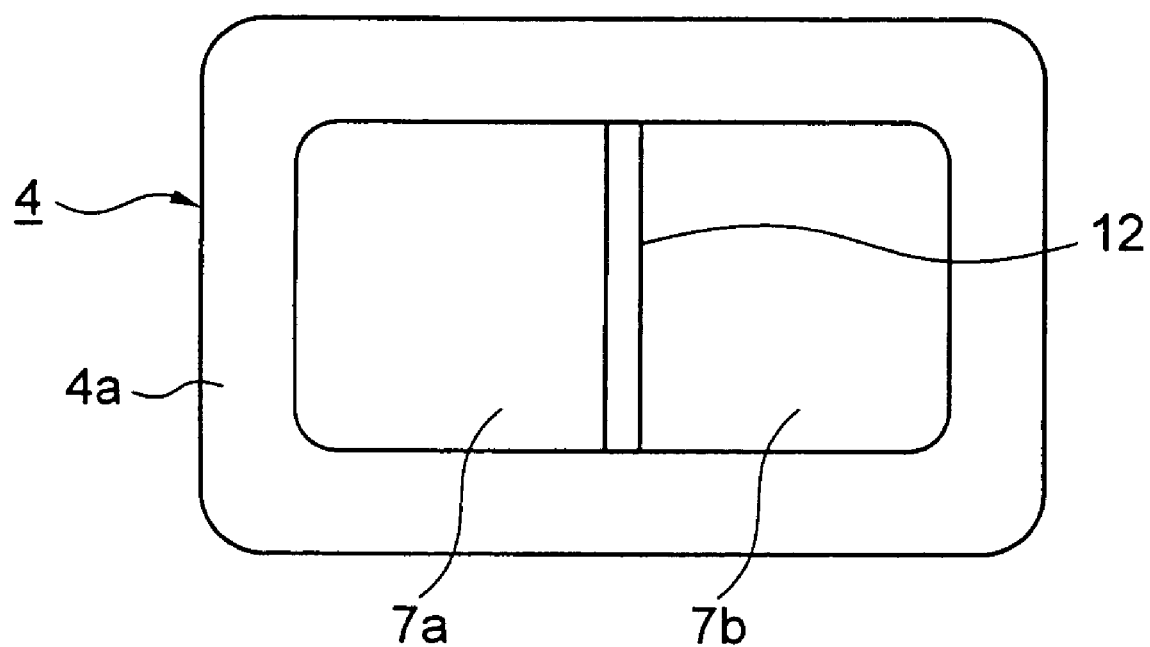
FIG. 4 is a plan view for explaining another embodiment of an insulation base of the surface mounted crystal unit of the present invention.
Figure 5A:
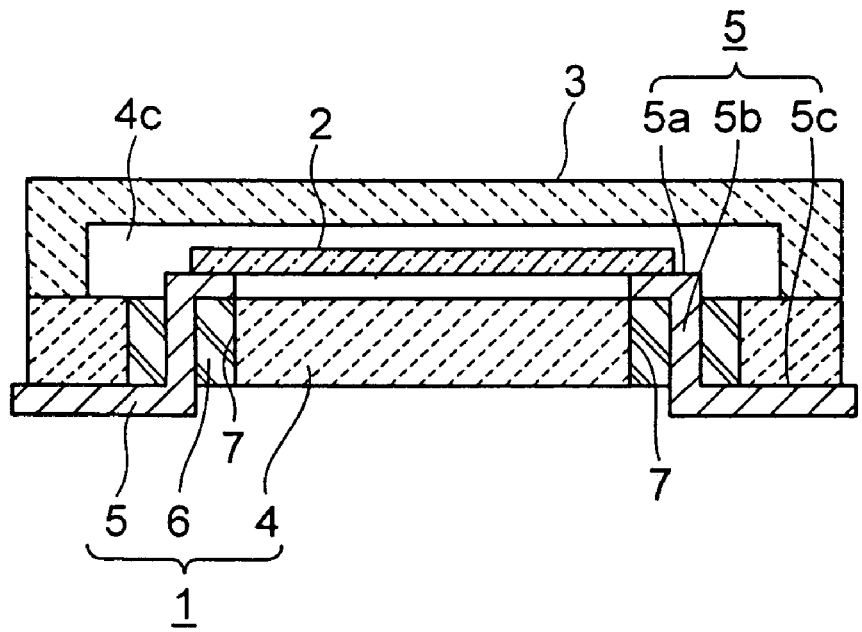
FIG. 5A is a vertical sectional view thereof.
Figure 5B:
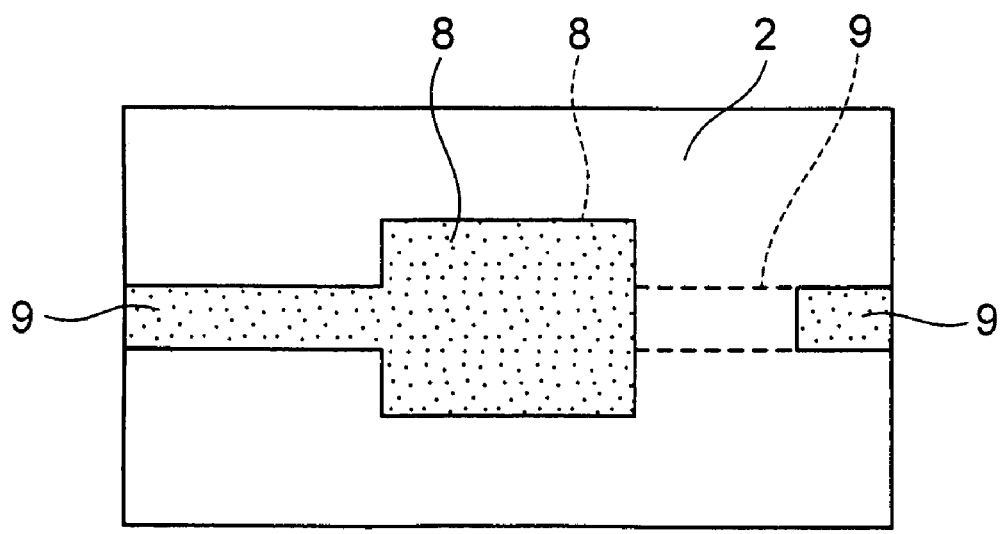
FIG. 5B is a plan view of a crystal element used therein.

In the above embodiments, the insulation base 4 is formed from the annular casing wall 4a, and the single through hole 7 is formed. However, for example as shown in the plan view in FIG. 4, a bridging part (beam) 12 may be provided over the center part of the insulation base 4 in order to enhance its strength.

Figure 6A:
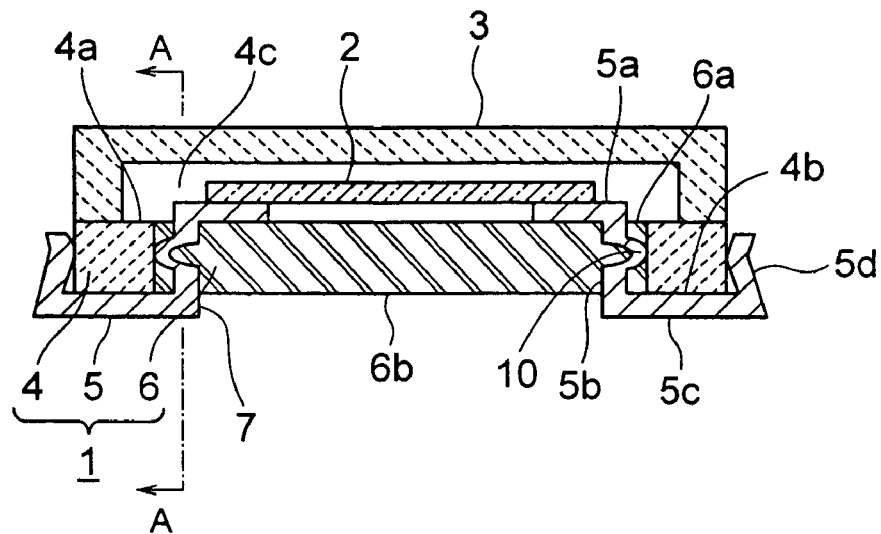
FIG. 6A is a vertical sectional view thereof.
Figure 6B:
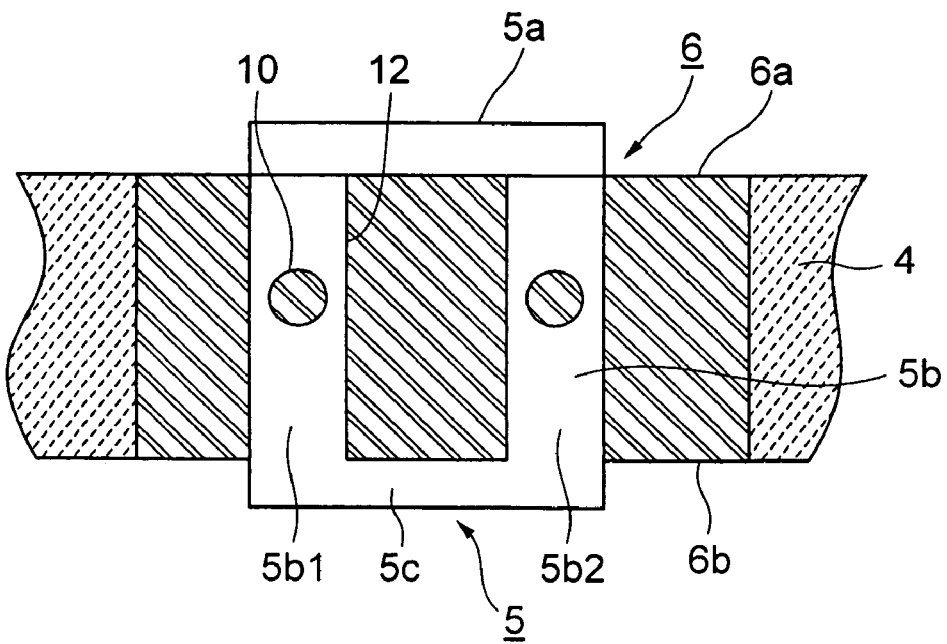
FIG. 6B is a partially enlarged cross sectional view of a surface mounting base along the line A—A of FIG. 6A.
Figure 7:
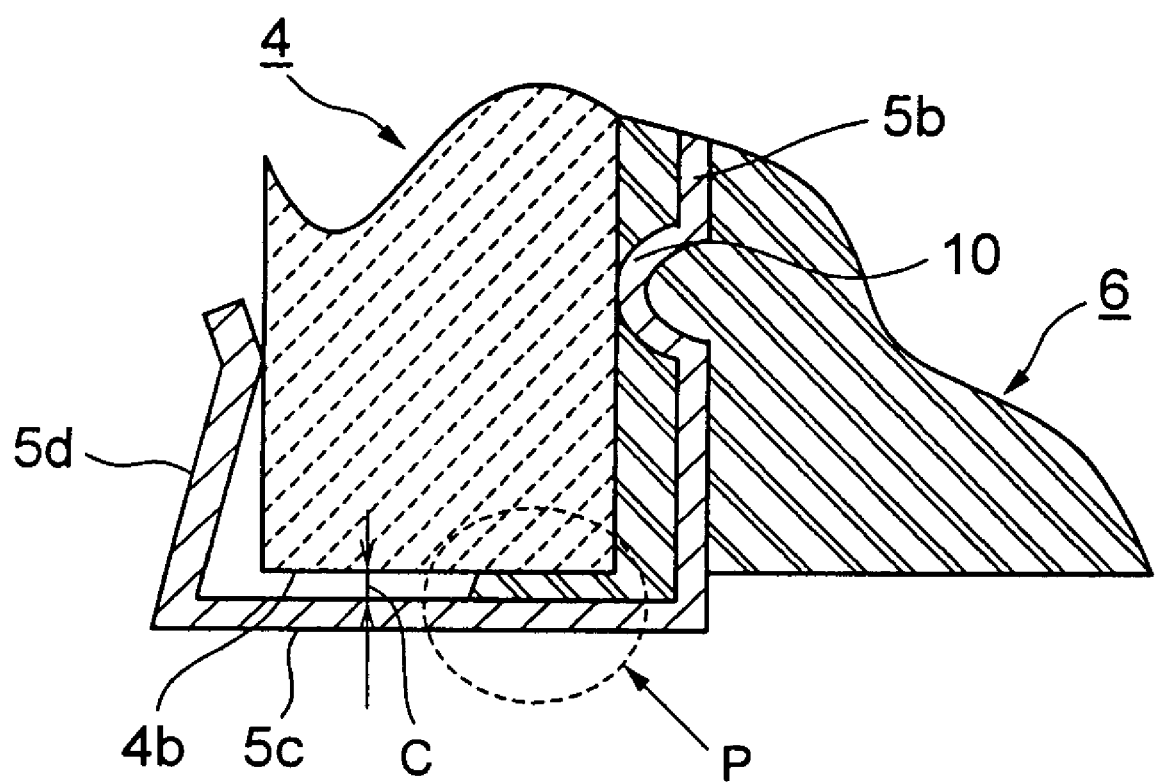
FIG. 7 is a partially enlarged vertical sectional view of the surface mounting base for explaining problems of the other conventional example mentioned above.

Moreover, one principal surface side of the insulation base 4 has been made higher than the top surface 6a of the sealing glass 6. However, it may be arranged on the same plane as seen in the conventional example. Furthermore, in one of the conventional examples shown in FIG. 6B, the through parts 5b of the J lead terminal 5 are made into first and second bifurcated through parts 5b1 and 5b2 by having a single slit. However, a plurality of bifurcated through parts may be formed by a plurality of slits for example. In short, molten glass only needs to readily enter the through part 5b. In addition, in the case where sufficient molten glass floods and enters due to the height of the projection 10 provided on the through part 5b, the slit may not be required. These arrangements can be appropriately selected as necessary.

Furthermore, the projection 10 is provided on the through part 5b of the lead terminal 5, and the folded part 5d has an elbow shape. However, both may be made having projecting shapes or elbow shapes. In short, the structure only needs to be able to elastically clamp from both surface sides of the annular casing wall 4a. In addition, a single through hole 7 is formed in the insulation base 4. However, a pair of through holes 7a and 7b may be provided to form an airtight terminal. However, when the size of the surface mounting base is smaller, having a single through hole 7 is more effective.

What is claimed is:

1. A surface mounting base for an oscillator that is provided with: an insulation base comprising a casing wall having a through hole; a sealing glass that is filled into said through hole and forms a space part on one principal surface side of said insulation base; and a lead terminal, which passes through said sealing glass and clamps an inner surface and an outer surface of said casing wall, and which has a holding part for a crystal element on a top surface of said sealing glass that is one principal surface side of said insulation base, and which has a tip end part bent in a concave shape projecting from a bottom surface of said sealing glass and extending from the inside of said casing wall towards the outside across a tip end surface, and in which said tip end part is soldered to said insulation base; wherein a base part of said lead terminal projects from the bottom surface of said sealing glass, and the inner surface of said tip end part of said lead terminal is distanced from the bottom surface of said sealing glass by at least the thickness of said lead terminal or more.

2. A surface mounting base for a crystal oscillator according to claim 1, wherein a bottom end face of said casing wall projects below the bottom surface of said sealing glass.

3. A surface mounting base for a crystal oscillator according to claim 1, wherein a projecting part is provided on the top and bottom tip end surfaces of said casing wall, and said projecting part on the bottom tip end surface projects below the bottom surface of said sealing glass.

4. A surface mounting base for a crystal oscillator according to claim 1, wherein the bottom tip end surface of said casing wall, and the inside face of the tip end part of said lead terminal are separated by a predetermined dimension.

5. A surface mounting base for a crystal oscillator according to claim 1, wherein said through hole is just one.

6. A surface mounting base for a crystal oscillator according to claim 1, wherein said casing wall which is positioned on one principal surface said of said insulation base is higher than the upper surface of said sealing glass, and has a space part that holds said crystal element on the inside of said casing wall.

7. A surface mounting base for a crystal oscillator according to claim 1, wherein said a lead terminal is a J a lead terminal.

8. A crystal oscillator wherein in the surface mounting base for a crystal oscillator according to claim 1, the holding part of said crystal element holds the periphery part of said crystal element, which has its extension electrodes extending from an excitation electrode, and a cover is placed over said surface mounting base for a crystal oscillator to hermetically seal said crystal element.

* * * * *